Figure 1:
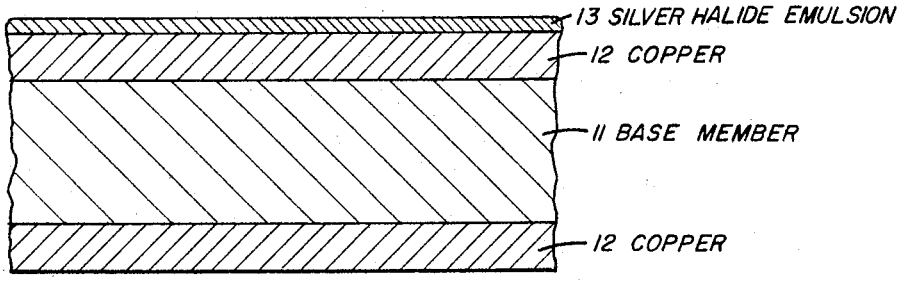
Figure 2:
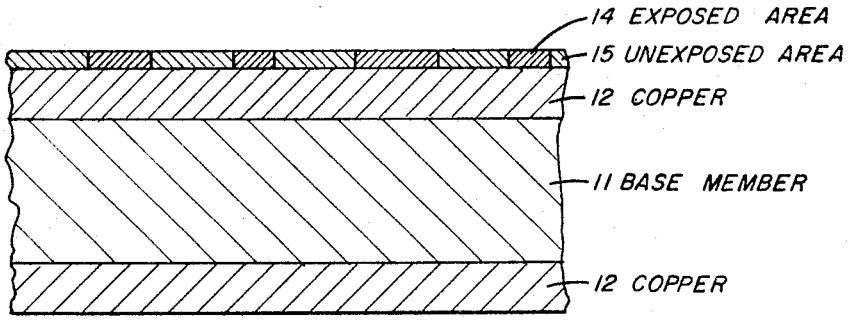

T862018

DEFENSIVE PUBLICATION

UNITED STATES PATENT OFFICE

Published at the request of the applicant or owner in accordance with the Notice of Apr. 11, 1968, 849 O.G. 1221. Identification is by serial number of the application and the heading indicates the number of pages of specification, including claims, and of sheets of drawing contained in the application as originally filed. The file of this application is available to the public for inspection; reproduction may be purchased for 30 cents per sheet.

Applications published under the Defensive Publication Program have not been examined as to the merits of alleged invention. The Patent Office makes no assertion as to the novelty of the disclosed subject matter.

PUBLISHED MAY 27, 1969

862 O.G. 1010

783,313
PRINTING PLATE ELEMENT
Thomas I. Abbott, % Kodak Park Division,
Rochester, N.Y. 14650
Filed Dec. 12, 1968. Published May 27, 1969
Int. Cl. G03c *1/36, 5/30;* G03f *7/06*
U.S. Cl. 96—36.3
1 Sheet Drawing. 10 Pages Specification

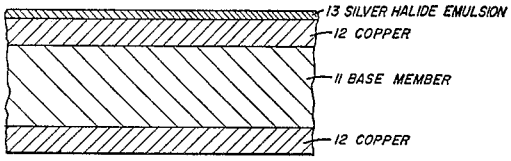

A stable, presensitized printing plate comprises a colloid layer presensitized with silver halide on a metal plate having a copper or copper-containing surface. The light sensitive layer is desensitized against non-selective development by migrating copper ions by a densensitizer such as benzotriazole, ethylene diamine tetraacetic acid and others.

SN - 783313 T862018

May 27, 1969 T. I. ABBOTT DEF. PUB.

PRINTING PLATE ELEMENT

Filed Dec. 12, 1968

THOMAS I. ABBOTT
INVENTOR

BY Henry E. Byers

ATTORNEY